(12) United States Patent
Nagasaki

(10) Patent No.: US 6,215,643 B1
(45) Date of Patent: Apr. 10, 2001

(54) ELECTROSTATIC CHUCK AND PRODUCTION METHOD THEREFOR

(75) Inventor: Koichi Nagasaki, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/379,067

(22) Filed: Aug. 23, 1999

(30) Foreign Application Priority Data

Aug. 31, 1998 (JP) .................................................. 10-244282

(51) Int. Cl.$^7$ .................................................. H02N 13/00
(52) U.S. Cl. ........................................... 361/234; 279/128
(58) Field of Search .............................. 361/234; 279/128

(56) References Cited

U.S. PATENT DOCUMENTS

| | | | |
|---|---|---|---|
| 5,701,228 | * 12/1997 | Ishii | 361/234 |
| 5,909,355 | * 6/1999 | Parkhe | 361/234 |

FOREIGN PATENT DOCUMENTS

| | | | |
|---|---|---|---|
| 62-094953A | 5/1987 | (JP) | H01L/21/68 |
| 04003956A | 1/1992 | (JP) | H01L/21/68 |

* cited by examiner

Primary Examiner—Fritz Fleming
(74) Attorney, Agent, or Firm—Hogan & Hartson, LLP

(57) ABSTRACT

An electrostatic chuck according to the present invention exhibits a greater attractive force by virtue of the Johnson-Rahbeck effect, while ensuring satisfactory insulation in a ceramic portion present below an electrostatic attraction electrode thereof in a temperature range of 250 to 450° C. The electrostatic chuck is produced by superposing green sheets printed with a conductive paste and green sheets not printed with the conductive paste in a predetermined order with a binding liquid applied on the respective green sheets, heat- and press-bonding the superposed green sheets and firing the heat- and press-bonded green sheets. During the production, a conductive component of the electrostatic attraction electrode is diffused into the ceramic portion present between the electrode and an attractive surface of the chuck.

14 Claims, 5 Drawing Sheets

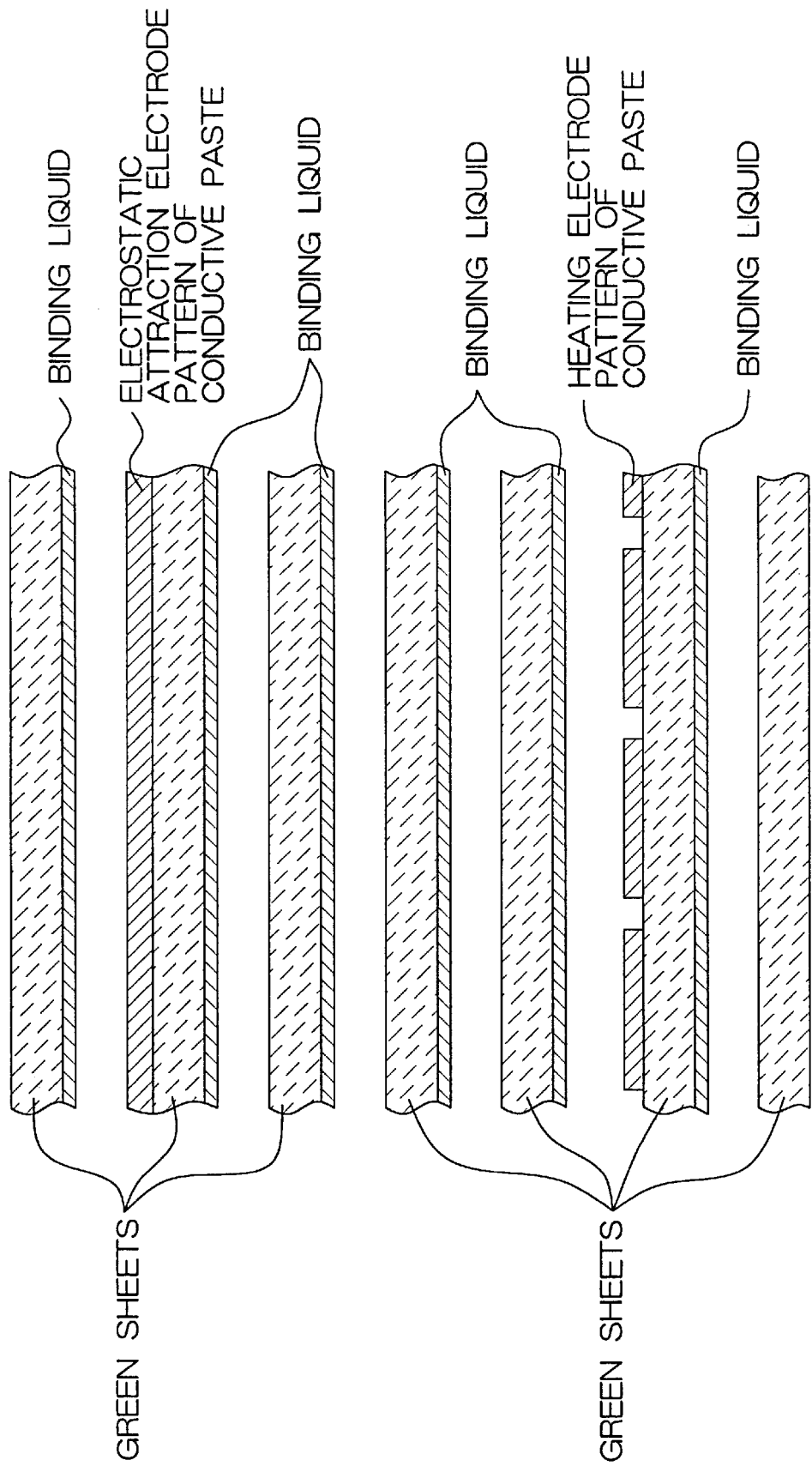

ELECTROSTATIC CHUCK AND PRODUCTION METHOD THEREFOR

This application is based on an application No. 10-244282 filed in Japan, the content of which is incorporated hereinto by reference.

BACKGROUND OF THE INVENTION

1. Field of the Invention

The present invention relates to an electrostatic chuck for holding an object such as a semiconductor wafer by electrostatic attraction and to a production method therefor. More particularly, the invention relates to an electrostatic chuck exhibiting a great attractive force even in a high temperature environment and to a production method therefor.

2. Description of the Prior Art

In semiconductor-related production processes, electrostatic chucks are conventionally employed for holding a semiconductor wafer in a reaction process chamber with a high level of accuracy in semiconductor processing apparatuses such as film forming apparatuses for forming a thin film on a semiconductor wafer by PVD, CVD, sputtering and the like and dry etching apparatuses for microprocessing a wafer.

In such a semiconductor processing apparatus, highly corrosive halogen gases such as fluorine- and chlorine-containing gases are employed for deposition, etching and cleaning, and a plasma is often generated. Since the electrostatic chucks are used under such severe conditions, the electrodes thereof need to be coated with a material highly resistant to the plasma and the corrosive halogen gases. To this end, electrostatic chucks have been proposed which include an electrode such as plate or film embedded in a ceramic plate.

The electrostatic attractive force of the electrostatic chucks which attracts an object such as a semiconductor wafer includes the Coulomb force which arises due to dielectric polarization and the Johnson-Rahbeck force which arises due to a small leak current. It is desirable to utilize the Johnson-Rahbeck effect which provides a greater attractive force.

Conventional electrostatic chucks utilizing the Johnson-Rahbeck effect are constructed such that a ceramic plate is comprised of a low resistant alumina ceramic containing a transition metal (Japanese Unexamined Patent Publication No. 62-94953 (1987)), and such that a ceramic plate includes two types of ceramic portions bonded to each other, one of which is comprised of a low resistant ceramic containing an impurity and the other of which is comprised of a high resistant ceramic containing no impurity (Japanese Unexamined Patent Publication No. 4-3956 (1992)).

To establish the Johnson-Rahbeck effect, a ceramic portion present between an electrode and an attractive surface of an electrostatic chuck needs to have a volume resistivity of not lower than $1 \times 10^9$ Ωcm and lower than $1 \times 10^{11}$ Ωcm in a process temperature range.

However, the conventional electrostatic chucks are intended to be used in a room temperature environment. Therefore, when such a chuck is used in a high temperature environment at 250 to 450° C. in the semiconductor processing apparatus, the resistivity of the ceramic portion present between the electrode and the attractive surface is lower than that in a room temperature, so that the leak current is increased. When the object to be held by the chuck is a semiconductor wafer, a minute circuit on the wafer may suffer from dielectric breakdown.

The amount of the transition metal or the impurity to be added to the ceramic may be adjusted to control the resistivity of the ceramic portion for utilization of the Johnson-Rahbeck effect in the high temperature environment. However, the resistivity of the ceramic portion is likely to vary, so that it is difficult to prepare a ceramic plate having a resistivity of not lower than $1 \times 10^9$ Ωcm and lower than $1 \times 10^{11}$ Ωcm in a temperature range of 250 to 450° C.

The electrostatic chuck which comprises a ceramic plate entirely composed of a low resistivity ceramic as disclosed in Japanese Unexamined Patent Publication No. 62-94953 suffers from considerable reduction in the resistivity of the entire ceramic plate in a high temperature environment. This makes it impossible to ensure sufficient insulation in the case where an electrode for plasma generation is fixed to the under surface of the electrostatic chuck.

In the case of the electrostatic chuck which comprises a ceramic plate including a low resistivity ceramic portion and a high resistivity ceramic portion bonded to each other as disclosed in Japanese Unexamined Patent Publication No. 4-3956, sinter-bonding of the ceramic portions is difficult. These ceramic portions are preferably bonded to each other by sintering to ensure a satisfactory corrosive and plasma resistance. However, it is difficult to sinter-bond the ceramic portions for preparation of the ceramic plate because the ceramic portions, even if composed of the same principal ceramic material, have different thermal expansion coefficients and shrinkage degrees at firing thereof due to the presence of the impurity.

SUMMARY OF THE INVENTION

It is a principal objective of the present invention to provide a ceramic electrostatic chuck which is capable of attractively holding an object by utilizing the Johnson-Rahbeck effect in a high temperature environment at 250 to 450° C., and to provide a production method therefor.

In accordance with the present invention, there is provided an electrostatic chuck which comprises a ceramic plate having a major surface serving as an attractive surface and an electrostatic attraction electrode embedded in the ceramic plate, and is adapted to attractively hold an object placed on the attractive surface by an electrostatic force induced by a potential difference between the object and the electrode, wherein a conductive component of the electrode is diffused in a ceramic portion present between the electrode and the attractive surface.

Particularly, the ceramic plate is composed of a ceramic principally comprising aluminum nitride, and the ceramic portion present between the electrode and the attractive surface has a volume resistivity of not lower than $1 \times 10^9$ Ωcm and lower than $1 \times 10^{11}$ Ωcm in a temperature range of 250 to 450° C.

The conductive component of the electrode is diffused in the ceramic portion present between the electrode and the attractive surface. Therefore, the ceramic portion present around the electrostatic attraction electrode has a smaller resistivity than the other portion of the ceramic plate. The resistivity of the ceramic portion present between the electrode and the attractive surface can be controlled at a level not lower than $1 \times 10^9$ Ωcm and lower than $1 \times 10^{11}$ Ωcm in a temperature range of 250 to 450° C. by controlling the diffusion of the conductive component of the electrode. Thus, the electrostatic chuck exhibits a greater attractive force by virtue of the Johnson-Rahbeck effect and, hence, is capable of firmly retaining the object with a high level of accuracy by the attractive force. Further, the ceramic portion present below the electrostatic attraction electrode has a satisfactory insulating property.

In a production method for the electrostatic chuck in accordance with the present invention, the ceramic plate is produced as a unitary member with no distinct juncture. Therefore, the electrostatic chuck is highly resistant to a plasma and corrosive halogen gases, such as fluorine- and chlorine-containing gases, employed for deposition, etching and cleaning when the electrostatic chuck is employed in a semiconductor processing apparatus. Accordingly, the electrostatic chuck has a prolonged service life.

The foregoing and other objects, features and effects of the present invention will become more apparent from the following description of the preferred embodiments with reference to the attached drawings.

BRIEF DESCRIPTION OF THE DRAWINGS

FIG. 5 is a diagram for explaining a production process for the electrostatic chuck according to the embodiment of the present invention.

DESCRIPTION OF THE PREFERRED EMBODIMENTS

The present invention will hereinafter be described by way of an embodiment thereof.

Figure 1A:
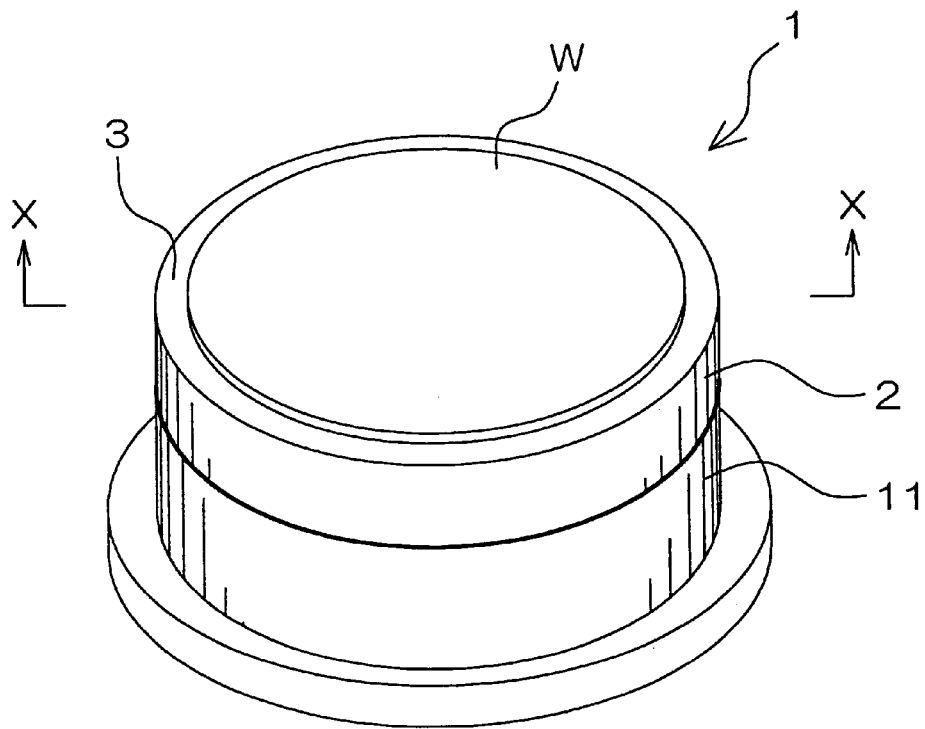
FIG. 1A is a perspective view illustrating an electrostatic chuck according to one embodiment of the present invention which is fixed on a base.
Figure 1B:
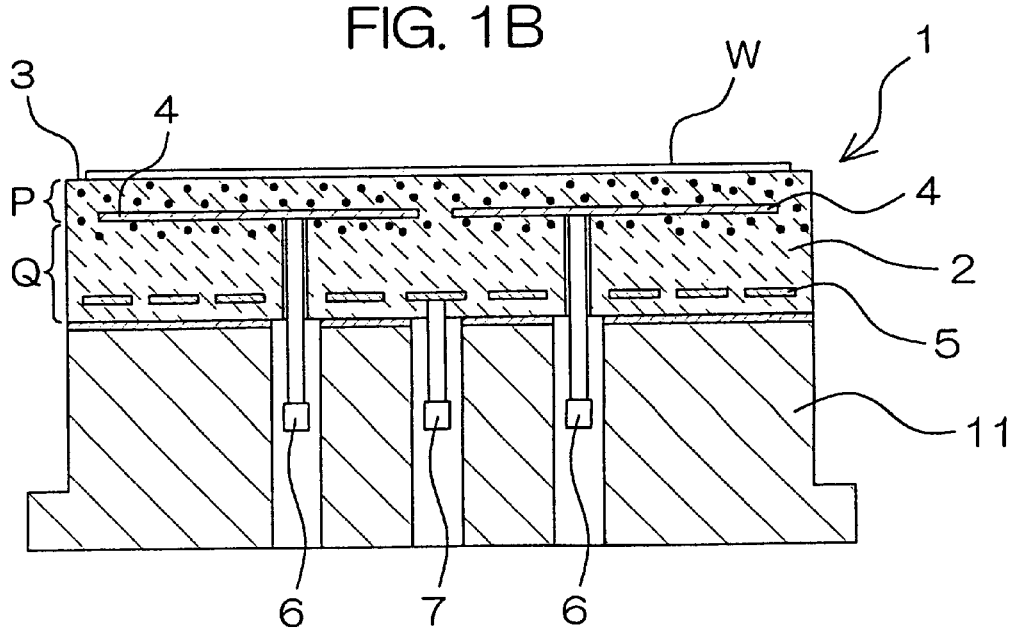
FIG. 1B is a sectional view taken along a line X—X in FIG. 1A.

FIG. 1A is a perspective view illustrating an electrostatic chuck 1 according to the embodiment of the present invention, which is fixed on a base 11, and FIG. 1B is a sectional view taken along a line X—X in FIG. 1A. The electrostatic chuck 1 includes a ceramic disk plate 2, and its top surface serves as an attractive surface 3 for attractive by holding an object W such as a semiconductor wafer to be held. Two electrodes 4 for electrostatic attraction and an electrode 5 for heating are embedded in the ceramic plate 2. The electrostatic attraction electrodes 4 are located adjacent the top surface (attractive surface 3) of the ceramic plate 2, while the heating electrode 5 is located adjacent the bottom surface of the ceramic plate 2.

Figure 2A:
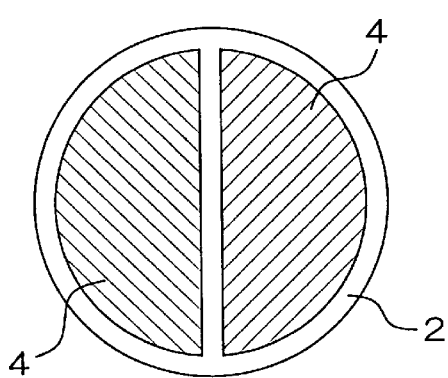
FIG. 2A is a plan view illustrating an electrode pattern for an electrostatic attraction electrode employed in the embodiment of the present invention.
Figure 3A:
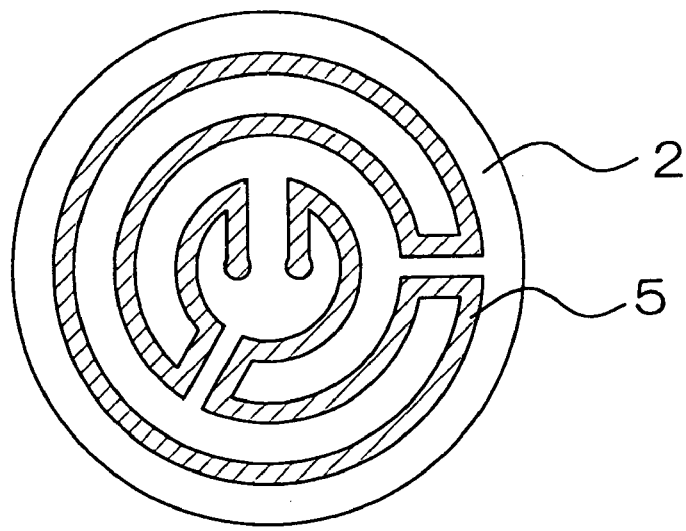
FIG. 3A is a plan view illustrating an electrode pattern for a heating electrode employed in the embodiment of the present invention.

The two electrostatic attraction electrodes 4 each have a semicircular shape, and are complementarily arranged in a circular electrode pattern as shown in FIG. 2A. The heating electrode 5 is formed a generally concentric continuous electrode pattern as shown in FIG. 3A. As shown in FIG. 1B, the electrostatic attraction electrodes 4 and the heating electrode 5 are electrically connected to power supply terminals 6 and 7, respectively, which are attached to the bottom surface of the ceramic plate 2.

Figure 2B:
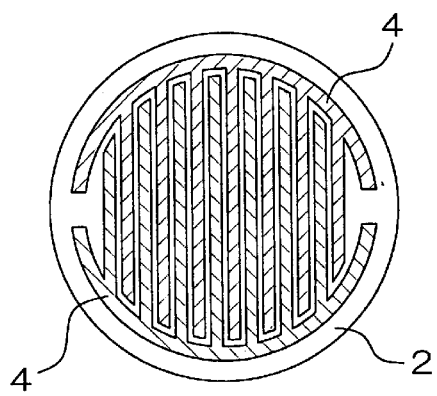
FIGS. 2B, 2C and 2D are plan views illustrating other possible electrode patterns for the electrostatic attraction electrode.
Figure 2C:
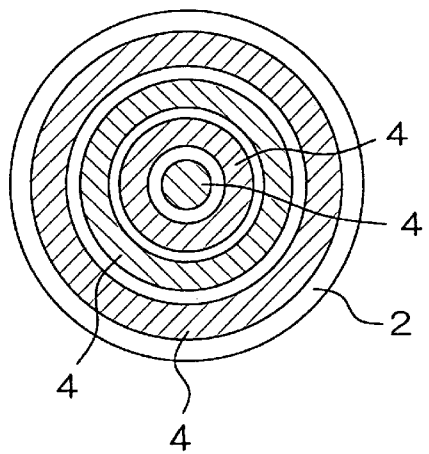
Figure 2D:
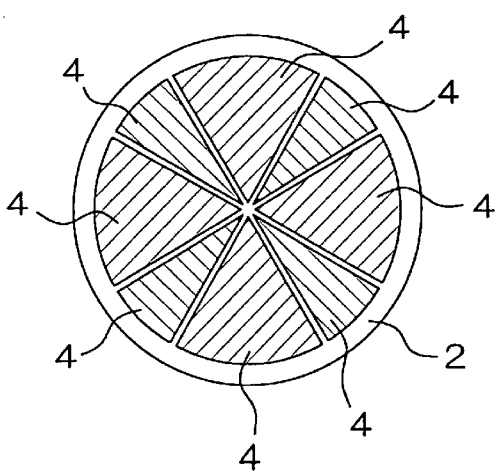
Figure 3B:
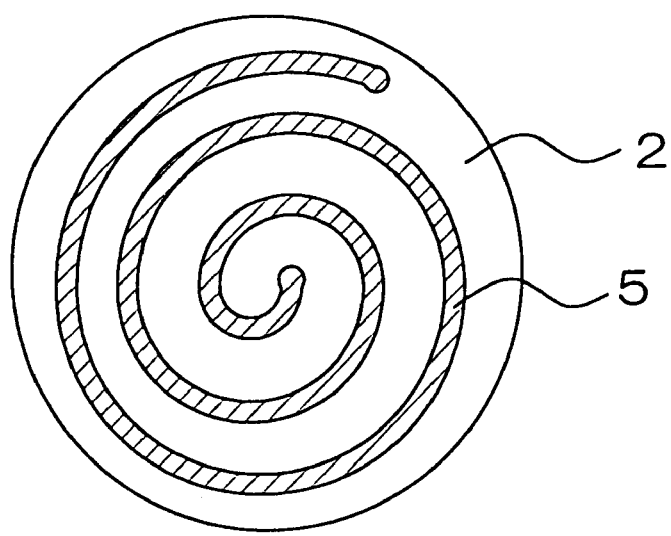
FIG. 3B is a plan view illustrating another electrode pattern for the heating electrode.

Instead of the electrode pattern for the electrostatic attraction electrodes 4 shown in FIG. 2A, any electrode patterns may be employed which ensure uniform attraction of the object W placed on the attractive surface 3. For example, it is possible to employ an electrode pattern in which two comb-shaped electrodes are combined with each other as shown in FIG. 2B, an electrode pattern in which a plurality of ring electrodes are arranged concentrically around a small circular electrode as shown in FIG. 2C, or an electrode pattern in which a plurality of fan-shaped electrodes are radially arranged as shown in FIG. 2D. Instead of the electrode pattern for the heating electrode 5 shown in FIG. 3A, any electrode patterns such as a spiral electrode pattern as shown in FIG. 3B may be employed which ensure uniform heating of the object W placed on the attractive surface 3.

Referring to FIGS. 1A and 1B, the metal base 11 is bonded to the bottom surface of the electrostatic chuck 1 by brazing or the like. The base 11 may serve as a heatsink and a plasma electrode.

In the electrostatic chuck 1 according to this embodiment, a conductive component of the electrodes 4 is diffused in a ceramic portion P present around the electrostatic attraction electrodes 4, particularly between the electrodes 4 and the attractive surface 3. The ceramic portion P is important which influences the attractive force to be exerted on the object W. The ceramic portion P has a thickness of 80 to 1,000 $\mu$m, preferably 100 to 500 $\mu$m. As will be described later, the conductive component of the electrodes 4 may be diffused to a distance not greater than 1,000 $\mu$m from the electrodes 4 within the ceramic portion P. Although the ceramic plate 2 is a unitary member with no distinct juncture, the ceramic portion P in which the conductive component of the electrodes 4 is diffused has a lower resistivity than a ceramic portion Q in which the conductive component of the electrodes 4 is not diffused.

A ceramic for the ceramic plate 2 is preferably corrosion- and plasma-resistant, and excellent in thermal characteristics such as heat conductivity and heat resistance to ensure uniform temperature distribution in the object W to be held on the attractive surface 3. Examples of the ceramic include dielectric ceramics principally comprising alumina, aluminum nitride, silicon nitride and the like. Among these, a dielectric ceramic principally comprising aluminum nitride is particularly preferred.

A ceramic material comprising aluminum nitride in a proportion of not lower than 98.5 wt. %, particularly 99.5 wt. % provides a ceramic having an excellent corrosion resistance with virtually no grain boundary. A ceramic material comprising aluminum nitride as a principal component and an oxide of a rare earth element such as Y or Er as a sintering agent in a proportion of 1 to 9 wt. % provides a ceramic having an excellent heat conductivity. For further enhancement of the corrosion resistance, the amount of Si to be contained as an impurity in the ceramic is reduced to not more than 1,500 ppm, and the total amount of Na, Ca, Fe and the like to be contained as impurities in the ceramic is reduced to not higher than 2,000 ppm.

The dielectric ceramic principally comprising aluminum nitride has a volume resistivity (hereinafter referred to simply as "resistivity") of not lower than $1 \times 10^{11}$ $\Omega$cm in a temperature range of 250 to 450° C., failing to provide the Johnson-Rahbeck effect when used as it is.

However, the diffusion of the conductive component of the electrodes 4 into the ceramic portion P present around the electrodes 4, particularly between the electrodes 4 and the attractive surface 3 makes it possible to easily control the resistivity of the ceramic portion P within the range of not lower than $1\times10^9$ Ωcm and lower than $1\times10^{11}$ Ωcm in a temperature range of 250 to 450° C. Thus, the electrostatic chuck is capable of holding the object W on the attractive surface 3 with a high level of accuracy in the high temperature environment by an electrostatic force utilizing the Johnson-Rahbeck effect.

In addition, the ceramic portion Q in which the conductive component of the electrodes 4 is not diffused has a resistivity of not lower than $1\times10^{11}$ Ωcm in a temperature range of 250 to 450° C. thereby to have a satisfactory insulating property. This prevents a leak current from the electrostatic attraction electrodes 4 from flowing into the base 11.

Figure 4:
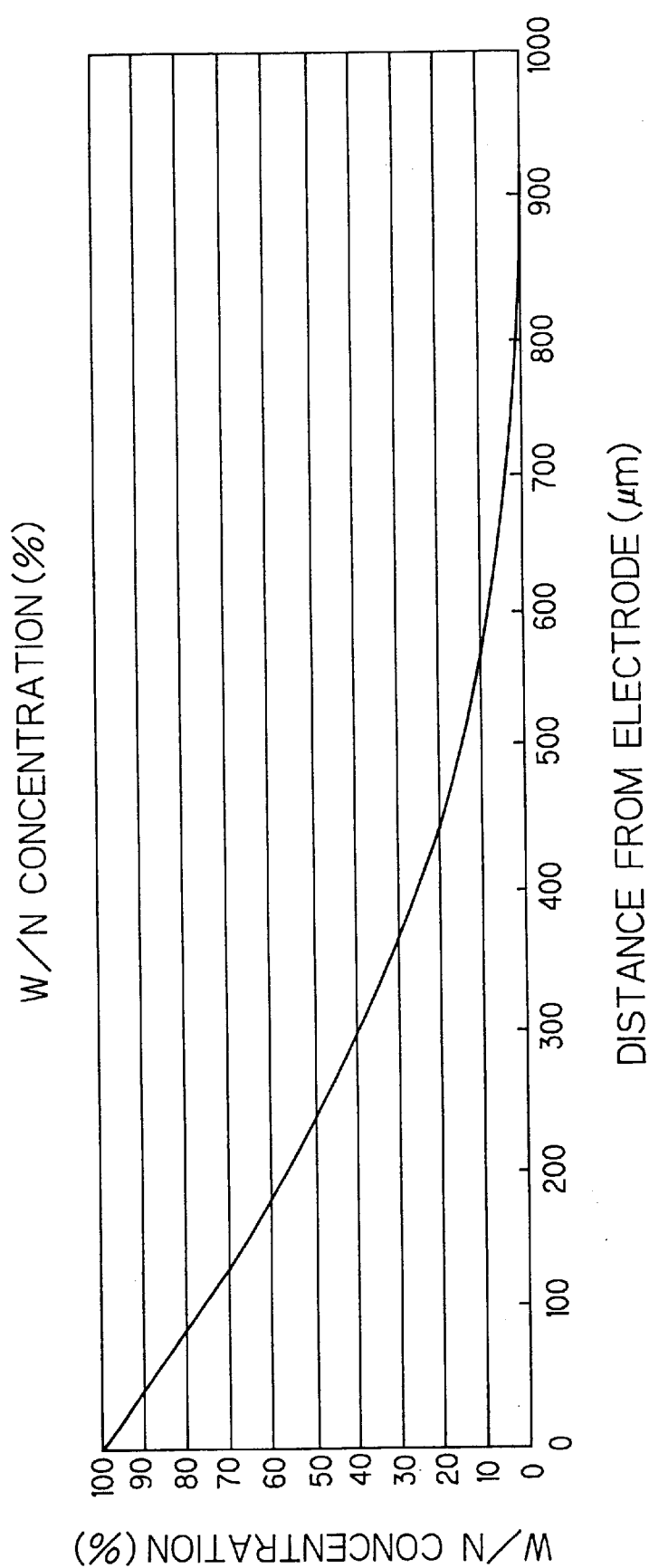
FIG. 4 is a graph illustrating a relationship between a distance from the electrostatic attraction electrode and the diffusion degree of tungsten which is the electrode components.

The inventor of the present invention repeatedly performed an experiment on conductive components for the electrodes 4 that can easily be diffused in the ceramic principally comprising aluminum nitride, and confirmed that tungsten (W) allows for the most easy diffusion and the most easy control of the resistivity of the ceramic. For example, FIG. 4 shows the diffusion of tungsten (W) as the conductive component of the electrodes 4 into the ceramic plate 2 composed of a ceramic principally comprising aluminum nitride (AlN content: 99 wt. %). In FIG. 4, the concentration of tungsten and the distance from the electrodes 4 are plotted as ordinate and abscissa, respectively. As shown in FIG. 4, the amount of tungsten (W) diffused in the ceramic plate decreases as the distance from the electrostatic attraction electrodes 4 increases. Tungsten can be diffused in the ceramic plate 2 with a distance not greater than 1,000 µm from the electrodes 4.

The inventor also confirmed that the ceramic plate has a resistivity on the order of $10^{11}$ Ωcm at 400° C. where the conductive component of the electrodes 4 is not diffused in the ceramic plate (W/N=0%), but can be reduced to lower than $1\times10^{11}$ Ωcm by diffusing tungsten (W) into the ceramic plate in a proportion of not smaller than W/N=1%.

Other usable conductive components for the electrostatic attraction electrodes 4 are tungsten carbide (WC), molybdenum (Mo), titanium (Ti) and titanium nitride (TiN). The degree of the diffusion of the conductive components of the electrodes 4 can be determined by means of an SIMS (secondary ion mass spectrometer).

For production of the electrostatic chuck 1, a ceramic material paste is prepared by blending a binder and a solvent with any of the various ceramic materials, and a plurality of green sheets are formed by spreading the paste by a tape forming method such as a doctor blade method. Then, as shown in FIG. 5, a conductive paste is applied in predetermined patterns on the corresponding green sheets for formation of the electrostatic attraction electrodes 4 and the heating electrode 5.

Thereafter, the respective green sheets are superposed in a predetermined order with a binding liquid applied on the green sheets. The binding liquid has a strong dissolvability and, when applied on surfaces of the green sheets, erodes the surfaces for activation thereof, thereby making it easier to heat- and press-bond the green sheets to each other. A specific example of the binding liquid will be described later.

The binding liquid is preferably applied onto the surfaces of all the green sheets to ensure easy heat- and press-bonding of the green sheets. However, the heat- and press-bonding of the green sheets can be achieved without the application of the binding liquid, so that the binding liquid may be applied at least between the surface of the green sheet for the ceramic portion P and the conductive paste for the electrostatic attraction electrodes 4. The application of the binding liquid onto the electrode pattern of the conductive paste makes it easier to diffuse the conductive component of the conductive paste into the green sheet for the ceramic portion P.

Then, the green sheets superposed in the predetermined order with the binding liquid applied thereon are heat- and press-bonded for preparation of a green sheet laminate. At this time, the binding liquid also erodes the electrode patterns of the conductive paste for the electrostatic attraction electrodes 4 and the heating electrode 5, so that the conductive component is easily diffused in the green sheets superposed on the electrode patterns of the conductive paste. In FIG. 5, as will be described later, the conductive component of the heating electrode 5 is diffused around the heating electrode 5, but the diffusion depth is not greater than 1,000 µm. Therefore, the insulation between the electrostatic attraction electrodes 4 and the heating electrode 5 is kept, moreover insulation between the heating electrode 5 and the base 11 is kept, so that the currents flowing through the electrodes will not interfere with each other nor leak.

Thus, the ceramic plate 2 in which the electrostatic attraction electrodes 4 and the heating electrode 5 are embedded and the conductive component of the electrodes 4 and 5 is diffused around the electrodes 4 and 5 is produced by cutting the green sheet laminate into a disk shape, degreasing the resulting disk, and firing the disk at a suitable ceramic sintering temperature.

In turn, the ceramic plate 2 is ground, as required, so that the distance between the electrostatic attraction electrodes 4 and the surface of the ceramic plate 2 closer to the electrodes 4 is adjusted to 80 to 1,000 µm. Further, the surface of the ceramic plate 2 closer to the electrodes 4 is polished to a center-line average roughness (Ra) of not greater than 0.5 µm as measured in conformity with JIS B 0601 to define the attractive surface 3. Holes are formed in the ceramic plate 2 as respectively extending from the attractive surface 3 and the surface opposite thereto to the electrostatic attraction electrodes 4 and the heating electrode 5, and power supply terminals 6 and 7 are respectively fixed in the holes by brazing so as to be electrically connected to the electrodes 4 and 5. Thus, the electrostatic chuck 1 is completed.

The superposition of the green sheets with the binding liquid applied thereon makes it possible to easily produce the ceramic plate 2 of the electrostatic chuck 1, as a unitary member with no distinct juncture, in which the conductive component of the electrodes 4, 5 are diffused around the electrodes 4, 5.

EXAMPLE

With reference to FIGS. 1A and 1B, an explanation will hereinafter be given to one specific example of the electrostatic chuck according to the present invention.

AlN powder having an average particle diameter of about 1.2 µm and a purity of not lower than 99% was blended with a binder and a solvent for preparation of a paste. A plurality of green sheets each having a thickness of about 0.4 mm were formed from the paste by a doctor blade method. A conductive paste prepared by blending WC powder and AlN powder in a ratio of 7:3 and adjusting the viscosity of the resulting blend was applied in a pattern as shown in FIG. 2A on one of the green sheets for formation of electrostatic attraction electrodes 4, and in a pattern as shown in FIG. 3A on another of the green sheets for formation of a heating electrode 5, by means of screen printing, respectively.

After a binding liquid prepared by blending ethyl hexyl ether and diethyl phthalate in a ratio of 3:1 was applied on the respective green sheets, the green sheets were superposed in a predetermined order, and heat- and press-bonded to each other at 80° C. by application of a pressure of 50 kg/cm² for preparation of a green sheet laminate, which was in turn cut into a disk shaped plate.

The resulting plate was degreased in vacuo for removal of the binder component contained therein, and then fired at about 2,000° C. in a vacuum atmosphere, while being mechanically pressed with a pressure of 50 kg/cm². Thus, an aluminum nitride ceramic plate 2 was obtained which had the electrostatic attraction electrodes 4 and the heating electrode 5 embedded therein and a ceramic portion in which the conductive component of the electrodes 4, 5 were diffused around the electrodes 4, 5.

The aluminum nitride ceramic of the ceramic plate 2 was examined for the composition and characteristics thereof. As a result, the ceramic had a purity of 99%, an average crystal particle diameter of 3 μm, an average pore diameter of 0.5 μm, a specific gravity of 3.2 and a heat conductivity of 100 W/m·K.

The ceramic plate 2 thus obtained was ground into a final shape having an outer diameter of 200 mm and a thickness of 15 mm so that a distance between the electrostatic attraction electrodes 4 and the surface thereof closer to the electrodes 4 was 500 μm. Then, the surface of the ceramic plate closer to the electrostatic attraction electrodes 4 was polished to a center-line average roughness (Ra) of 0.2 μm to define an attractive surface 3. Holes were formed as extending from the attractive surface 3 and the surface opposite thereto to the electrodes 4, 5, and power supply terminals 6, 7 were fixed in the holes by brazing. Thus, the electrostatic chuck 1 was completed.

An electrostatic chuck A in which the conductive component of the electrostatic attraction electrodes 4 was diffused around the electrodes 4 was produced in the aforesaid manner as an example of the present invention. As comparative examples, a conventional electrostatic chuck B in which the conductive component of the electrodes 4 was not diffused was produced by a hot press method, and a conventional electrostatic chuck C which included a ceramic plate composed of a low resistivity ceramic was produced. These electrostatic chucks A, B, C were each fixed on an aluminum base 11 by brazing. An experiment was performed on these electrostatic chucks A, B, C to determine the resistivity and attractive force thereof and the leak current flowing between the electrodes 4 thereof and the base 11 when the chucks were heated at 400° C. in vacuo.

The electrostatic chucks B and C had the same dimensions and substantially the same construction as the electrostatic chuck A, except that a ceramic plate 2 of the electrostatic chuck B was composed of the same aluminum nitride ceramic as the ceramic plate 2 of the electrostatic chuck A but in which the conductive component of the electrostatic attraction electrodes was not diffused, and that a ceramic plate 2 of the electrostatic chuck C which was composed of a ceramic comprising aluminum nitride (the same ceramic material as used for the ceramic plate 2 of the electrostatic chuck A) and a Ti additive.

For measurement of the attractive force, the electrostatic chucks were each allowed to attract a 1 cm square silicon substrate placed thereon, and a force required to remove the silicon substrate therefrom by means of a load cell was determined as the attractive force. For determination of the leak current, an electric current flowing between the electrostatic attraction electrodes 4 and the base 11 was measured in conformity with JIS C 2141 by means of a fine ammeter. With the ceramic plate 2 being divided into two ceramic portions along the electrostatic attraction electrodes 4, the resistivity of the ceramic portion Q (see FIG. 1B) present between the electrodes 4 and the base 11 was determined on the basis of the electric current flowing between the electrodes 4 and the base 11, and the resistivity of the ceramic portion P (see FIG. 1B) present between the electrodes 4 and the silicon substrate was determined on the basis of the electric current flowing between the electrodes 4 and the silicon substrate.

The results are shown in Table 1.

TABLE 1

|  | Applied voltage | Attractive force | Leak current | Resistivity (Ωcm) | |
| --- | --- | --- | --- | --- | --- |
|  |  |  |  | Portion P | Portion Q |
| Chuck A | 500 V | 500 g/cm² | 0.06 mA | 1 × 10⁹ | 1 × 10¹¹ |
| Chuck B | 500 V | 40 g/cm² | 0.06 mA | 1 × 10¹¹ | 1 × 10¹¹ |
| Chuck C | 500 V | 500 g/cm² | 6.28 mA | 1 × 10⁸ | 1 × 10⁸ |

As a result, the electrostatic chuck B failed to establish the Johnson-Rahbeck effect because the ceramic portion P present between the electrostatic attraction electrodes 4 and the attractive surface 3 had a resistivity of 1×10¹¹ Ωcm, thereby exhibiting the smallest attractive force, i.e., 40 g/cm². The electrostatic chucks A and C successfully established the Johnson-Rahbeck effect because the ceramic portion P present between the electrostatic attraction electrodes 4 and the silicon substrate had a resistivity of lower than 1×10¹¹ Ωcm, thereby exhibiting an attractive force of 100 g/cm² which is suitable for practical applications.

In the case of the electrostatic chuck C, however, the ceramic plate 2 thereof had a resistivity of not higher than 1×10⁸ Ωcm as a whole, and the leak current from the electrodes 4 to the base 11 far exceeded 1 mA which is the upper limit of the allowable leak current specified by the Electrical Appliances Regulation. Therefore, the electrostatic chuck C was not suitable for practical applications. Where the object W to be held is a semiconductor wafer, a greater level of the leak current in the electrostatic chuck C may adversely influence the object W.

In view of the results, only the electrostatic chuck A of the example according to the present invention exhibited a sufficient attractive force and a satisfactory insulating property in a high temperature environment at 400° C.

Although the example according to the present invention employed a ceramic principally comprising aluminum nitride for the ceramic plate 2 of the electrostatic chuck 1, it is needless to say that ceramics principally comprising alumina and silicon nitride may be employed.

While the embodiment of the present invention has thus been described in detail, it should be understood that the embodiment is merely illustrative of the technical principles of the present invention but not limitative of the same. The spirit and scope of the present invention are to be limited only by the appended claims.

What is claimed is:

1. An electrostatic chuck for attractively holding an object by an electrostatic force occurring between the object and an electrode, the electrostatic chuck comprising:

a ceramic body of unitary construction with no distinct juncture between layers, the ceramic body having an attractive surface for attractively holding the object;

an electrostatic attraction electrode formed from a conductive paste containing a predetermined conductive component, said attraction electrode embedded within the ceramic body at a predetermined depth from the attractive surface;

a conductive component diffusion region into which the conductive component from the electrostatic attraction electrode has diffused, the conductive component diffusion region being provided in a ceramic portion defined between the electrostatic attraction electrode and the attractive surface.

2. An electrostatic chuck as set forth in claim 1, wherein the ceramic portion defined between the electrostatic attraction electrode and the attractive surface has a thickness of 80 $\mu$m to 1,000 $\mu$m.

3. An electrostatic chuck as set forth in claim 1, wherein the ceramic portion defined between the electrostatic attraction electrode and the attractive surface has a thickness of 100 $\mu$m to 500 $\mu$m.

4. An electrostatic chuck as set forth in claim 1,
wherein the ceramic plate is composed of a ceramic principally comprising aluminum nitride,
wherein the conductive component of the electrostatic attraction electrode is tungsten.

5. An electrostatic chuck as set forth in claim 1, wherein the ceramic portion defined between the electrostatic attraction electrode and the attractive surface has a volume resistivity of not lower than $1 \times 10^9$ $\Omega$cm and lower than $1 \times 10^{11}$ $\Omega$cm in a temperature range of 250° C. to 450° C.

6. An electrostatic chuck as set forth in claim 4, wherein the ceramic portion defined between the electrostatic attraction electrode and the attractive surface has a volume resistivity of not lower than $1 \times 10^9$ $\Omega$cm and lower than $1 \times 10^{11}$ $\Omega$cm in a temperature range of 250° C. to 450° C.

7. An electrostatic chuck as set forth in claim 1, further comprising a heating electrode embedded in a deeper position from the attractive surface than the electrostatic attraction electrode within the ceramic plate for heating the object.

8. An electrostatic chuck as set forth in claim 1, which is provided on a base serving as a heatsink or a plasma electrode with a surface thereof opposite from the attractive surface of the ceramic plate being bonded to the base.

9. An electrostatic chuck as set forth in claim 1,
wherein the ceramic plate has a disk shape,
wherein the electrostatic attraction electrode includes first and second electrodes to which voltages of different polarities are applied, and the first and second electrodes are complementarily configured in a generally circular pattern.

10. An electrostatic chuck as set forth in claim 7,
wherein the ceramic plate has a disk shape,
wherein the electrostatic attraction electrode includes first and second electrodes to which voltages of different polarities are applied, and the first and second electrodes are complementarily configured in a generally circular pattern,
wherein the heating electrode is configured in a spiral or concentric pattern to ensure substantially uniform heating of the object.

11. An electrostatic chuck production method, comprising the steps of:

preparing a paste by blending a binder and a solvent with a powdered ceramic material;

forming a plurality of green sheets from the paste;

applying a conductive paste containing a conductive element to a surface of one of the plurality of green sheets to form an electrode pattern for an electrostatic attraction electrode;

applying a binding liquid to the green sheet surface with the electrostatic attraction electrode pattern of the conductive paste to facilitate diffusion of the conductive element;

forming a green sheet laminate in which the electrostatic attraction electrode pattern of the conductive paste is embedded by superposing the plurality of green sheets and press-bonding the superposed green sheets;

heat- and press-bonding the superposed green sheets to form a green sheet laminate; and firing the green sheet laminate to form a ceramic body in which the electrostatic attraction electrode is embedded and in which the conductive element has diffused from the electrode into ceramic between the electrode and an upper surface of the ceramic body.

12. An electrostatic chuck production method as set forth in claim 11, further comprising the step of applying a conductive paste on a surface of another of the green sheets for formation of an electrode pattern for a heating electrode between the green sheet forming step and the green sheet superposing step.

13. An electrostatic chuck production method as set forth in claim 11, further comprising the step of polishing a surface of the ceramic body so that a distance between the electrostatic attraction electrode and the polished surface which serves as an attractive surface is adjusted to 80 $\mu$m to 1,000 $\mu$m, after the firing step for the formation of the ceramic body.

14. An electrostatic chuck production method as set forth in claim 11,
wherein the powdery ceramic material is AlN powder having an average particle diameter of about 1.2 $\mu$m and a purity of not lower than 99%,
wherein the conductive paste is prepared by blending WC powder and AlN powder and adjusting a viscosity of the resulting blend.

* * * * *